(12) United States Patent
Fu et al.

(10) Patent No.: US 9,922,888 B2
(45) Date of Patent: Mar. 20, 2018

(54) GENERAL FOUR-PORT ON-WAFER HIGH FREQUENCY DE-EMBEDDING METHOD

(71) Applicant: Tsinghua University, Beijing (CN)

(72) Inventors: Jun Fu, Beijing (CN); Yu-dong Wang, Beijing (CN); Jie Cui, Beijing (CN); Yue Zhao, Beijing (CN); Wen-pu Cui, Beijing (CN); Zhi-hong Liu, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 15/143,921

(22) Filed: May 2, 2016

(65) Prior Publication Data

US 2017/0287792 A1    Oct. 5, 2017

(51) Int. Cl.
| | |
|---|---|
| *G01R 31/26* | (2014.01) |
| *H01L 21/66* | (2006.01) |
| *G01R 27/28* | (2006.01) |
| *G01R 27/26* | (2006.01) |
| *G01R 27/02* | (2006.01) |

(52) U.S. Cl.
CPC .............. *H01L 22/14* (2013.01); *G01R 27/02* (2013.01); *G01R 27/2623* (2013.01); *G01R 27/28* (2013.01); *H01L 22/32* (2013.01)

(58) Field of Classification Search
None
See application file for complete search history.

(56) References Cited

U.S. PATENT DOCUMENTS

2012/0197593 A1*  8/2012  Guo .................... G01R 31/2648
                                                                 702/170

* cited by examiner

*Primary Examiner* — Calvin Choi
(74) *Attorney, Agent, or Firm* — Muncy, Geissler, Olds & Lowe, P.C.

(57) ABSTRACT

The present invention provides a general four-port on-wafer high frequency de-embedding method. The method comprises: for each on-wafer de-embedding dummy, building a model considering the distributive nature of high frequency characteristics of the on-wafer de-embedding dummy; obtaining the intrinsic Y-parameter admittance matrix of said N on-wafer de-embedding dummies by calculation or simulation by using said models; and solving the equation set which the corresponding measurement and calculation or simulation data of said on-wafer de-embedding dummies satisfy for the elements of the related admittance matrices of the parasitic four-port network to be stripped in de-embedding and model parameters of models on which said calculation or simulation is based.

6 Claims, 6 Drawing Sheets

GENERAL FOUR-PORT ON-WAFER HIGH FREQUENCY DE-EMBEDDING METHOD

TECHNICAL FIELD

The present invention relates to a high frequency de-embedding method, particularly an on-wafer high frequency de-embedding method, and more particularly a general four-port on-wafer high frequency de-embedding method.

BACKGROUND OF THE PRESENT INVENTION

The high frequency characterization measurements, performed on various active and passive electronic devices, semiconductor devices and integrated circuits thereof prepared on a wafer made of silicon and other semiconductor materials, are the basis for device modeling and model parameter extraction and circuit design and evaluation. This high frequency characterization measurement, particularly the high frequency characterization measurement for model parameter extraction of devices, must correspond to specific ports of a device under test (DUT), the locations of which are precisely defined. For this reason, it is necessary to remove all the parasitics, added by instruments, cables, probes and on-wafer testing set-up required to perform the high frequency measurement, from the raw data of the measurement. This is known as the so-called calibration procedure which is a key technique for ensuring accurate extraction of model parameters of high frequency devices.

Figure 1:
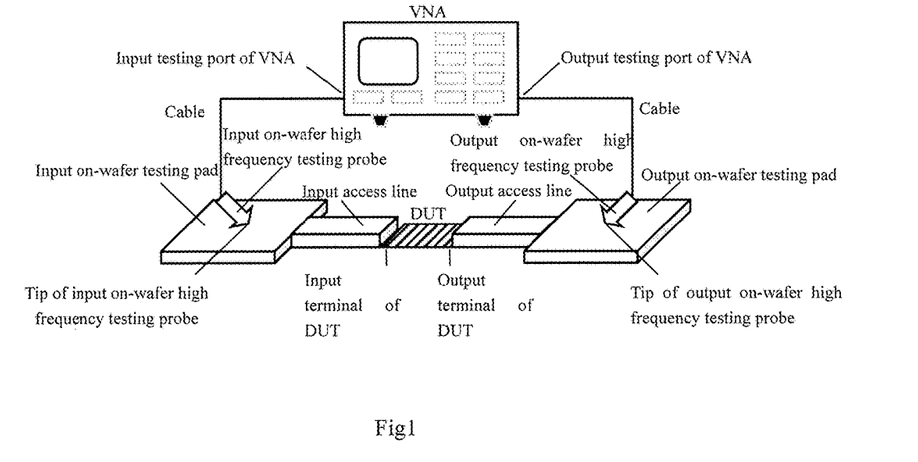
FIG. 1 is a schematic view of an on-wafer high frequency characterization measurement set-up.
Figure 2:
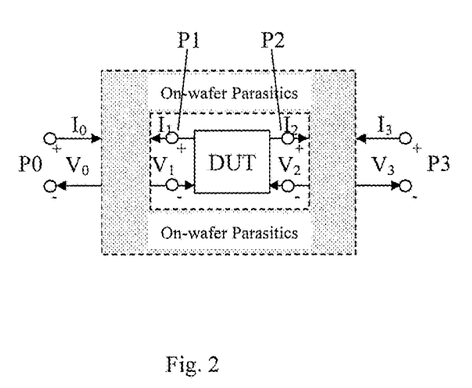
FIG. 2 is a schematic view of a general parasitic four-port network for an on-wafer high frequency characterization measurement.

With regard to the on-wafer high frequency measurement, calibration in a broad sense consists of two steps: off-wafer calibration and on-wafer de-embedding. In the first step, by off-wafer calibration, a test reference plane is moved from vector network analyzer (VNA) to the tip of on-wafer high frequency testing probes by using a set of impendence standard substrate (ISS) calibration dummies (generally made of alumina ceramic substrate). Techniques usually adopted here include short-open-load-thru (SOLT), line-reflect-reflect-match (LRRM), thru-reflect-line (TRL), four-port method (16-term error model), and the like. In the second step, by on-wafer de-embedding, the test reference plane is further shifted to ports of the DUT by using a suite of on-wafer de-embedding dummies. In recent years, a general four-port on-wafer de-embedding method has been proposed to strip the related parasitics of on-wafer measurements. The physical basis of the so-called general four-port method is to describe all the parasitics between the tips of the probes and the ports of the DUT by including them in a general four-port network, the four ports of which are defined at the tips of the probes and the ports of the DUT, respectively. FIG. 1 is a schematic view of an on-wafer high frequency characterization measurement set-up, wherein input and output testing ports of the VNA configured to test S parameters of the DUT are connected through high frequency cables to input and output on-wafer high frequency testing probes, respectively. The tips of the said probes are made contact with the surfaces of input and output on-wafer probing pads, respectively, and the sad probing pads are connected through on-wafer input and output access lines to input and output terminals of the DUT, respectively. FIG. 2 is a schematic view of the corresponding general parasitic four-port network. Here, the tip of the input testing probe, the input terminal of the DUT, the output terminal of the DUT, and the tip of the output testing probe are defined as port 0, port 1, port 2 and port 3 of the said parasitic four-port network, respectively, and those ports are denoted by P0, P1, P2 and P3, respectively. The following equation (1) can be obtained through proper theoretical derivation:

$$Y_M = Y_{ee} - Y_{ei}(Y_A + Y_{ii})^{-1} Y_{ie} \quad (1)$$

where, $Y_A$ denotes the Y-parameter 2×2 admittance matrix from P1 to P2, i.e., the intrinsic two-port Y-parameter 2×2 admittance matrix of the DUT; $Y_M$ denotes the Y-parameter 2×2 admittance matrix from P0 to P3, i.e., the measured whole two-port Y-parameter 2×2 admittance matrix of the DUT including all the on-wafer parasitics; and $Y_{ee}$, $Y_{ii}$, $Y_{ei}$ and $Y_{ie}$ are four Y-parameter 2×2 admittance sub-matrices of the Y-parameter 4×4 admittance matrix for describing those parasitic four-port network characteristics. Equation (1) is transformed to Equation (2):

$$Y_A = -Y_{ii} - Y_{ie}(Y_M - Y_{ee})^{-1} Y_{ei} \quad (2)$$

Figure 3:
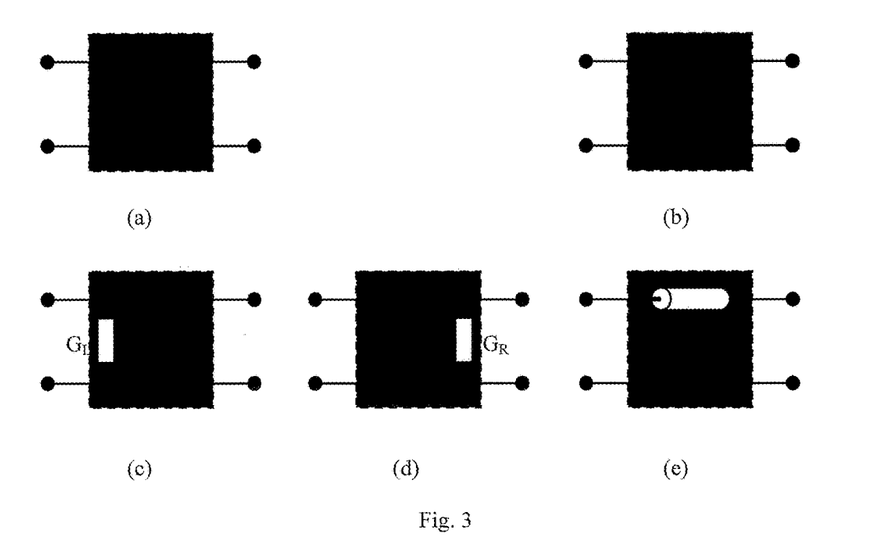
FIG. 3 shows the equivalent circuits of five on-wafer de-embedding two-port dummies generally used in the prior art of the general four-port on-wafer high frequency de-embedding method: Open O (a), Short S (b), Left L (c), Right R (d) and Thru T (e)
Figure 4:
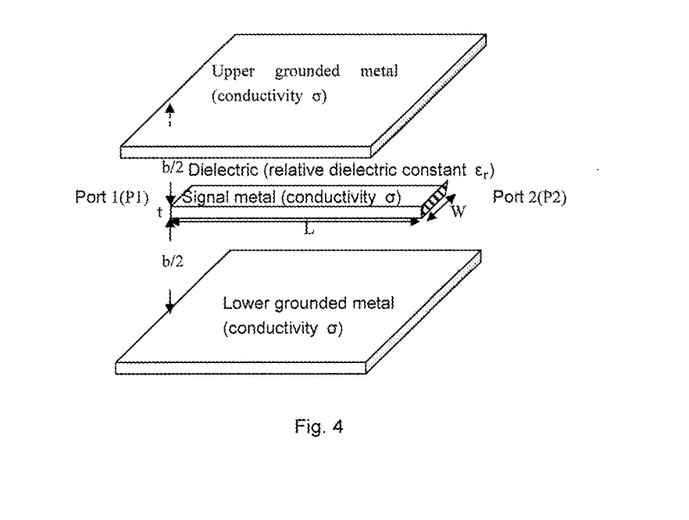
FIG. 4 is a schematic view of a strip-line Thru (T) on-wafer de-embedding dummy in Implementation 1.
Figure 5:
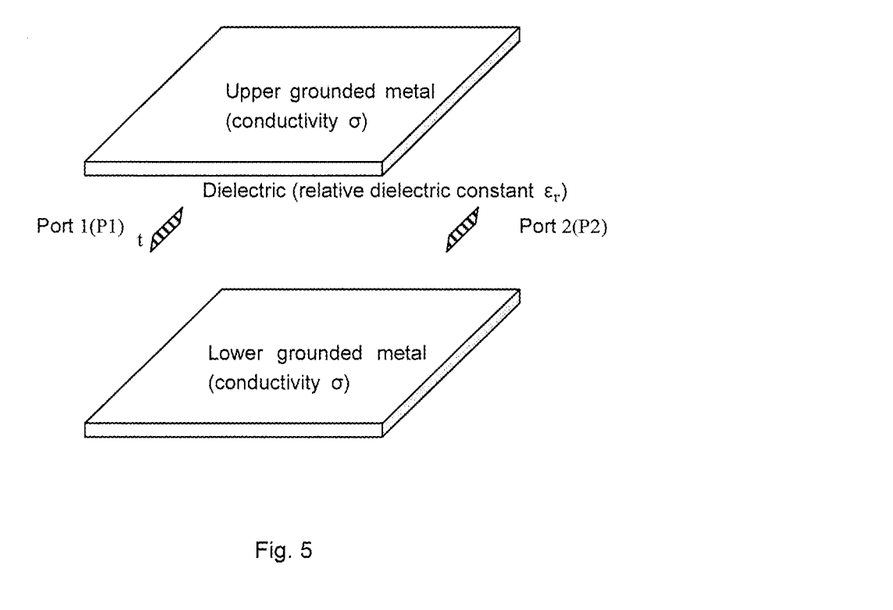
FIG. 5 is a schematic view of an Open (O) on-wafer de-embedding dummy in Implementation 1.
Figure 6:
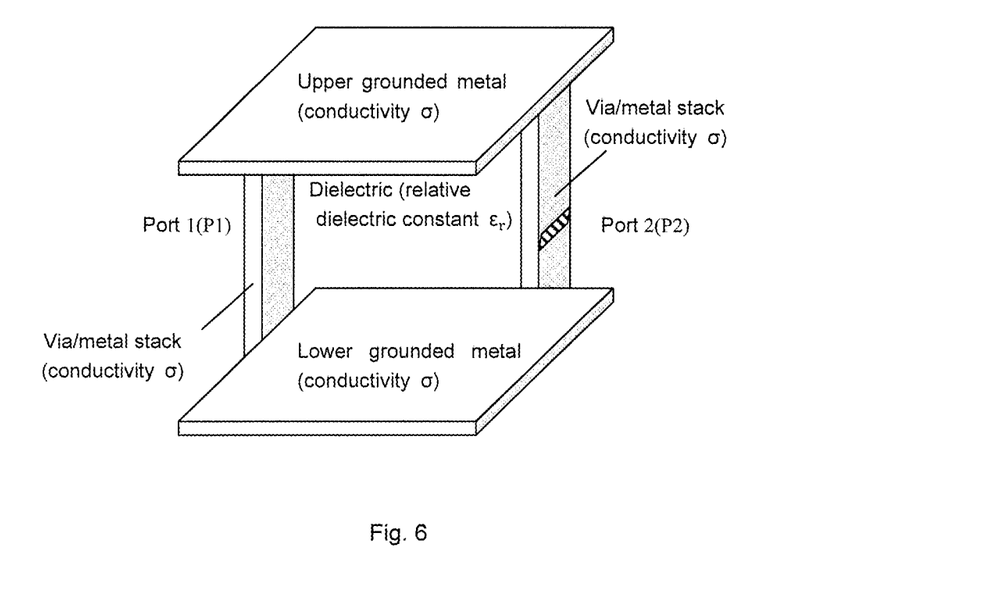
FIG. 6 is a schematic view of a Short (S) on-wafer de-embedding dummy in Implementation 1.
Figure 7:
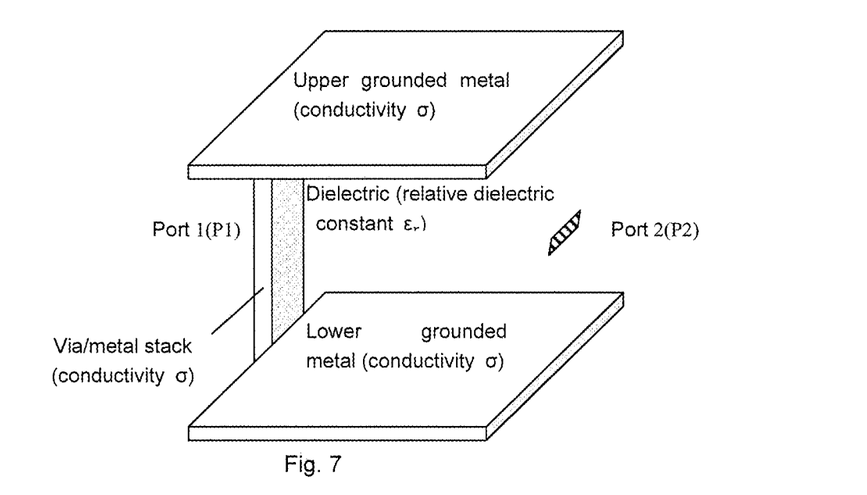
FIG. 7 is a schematic view of a Left (L) on-wafer de-embedding dummy in Implementation 1.
Figure 8:
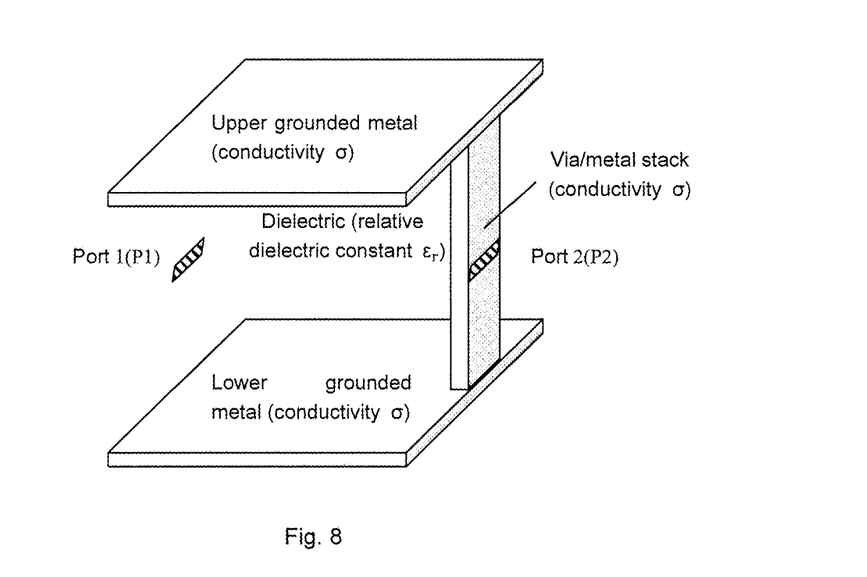
FIG. 8 is a schematic view of a Right (R) on-wafer de-embedding dummy in Implementation 1.
Figure 9:
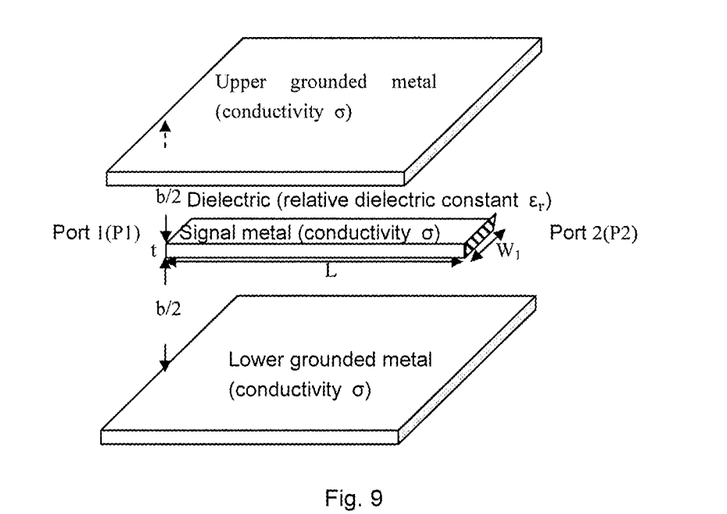
FIG. 9 is a schematic view of a Thru 1 (T1) on-wafer de-embedding dummy in Implementation 2.
Figure 10:
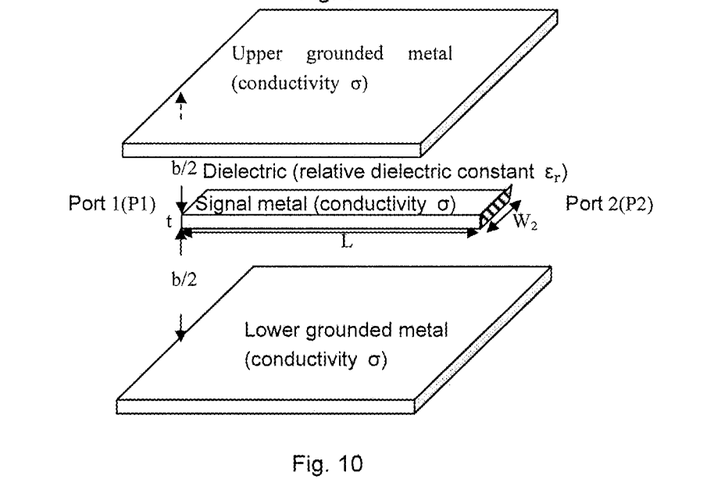
FIG. 10 is a schematic view of a Thru 2 (T2) on-wafer de-embedding dummy in Implementation 2.
Figure 11:
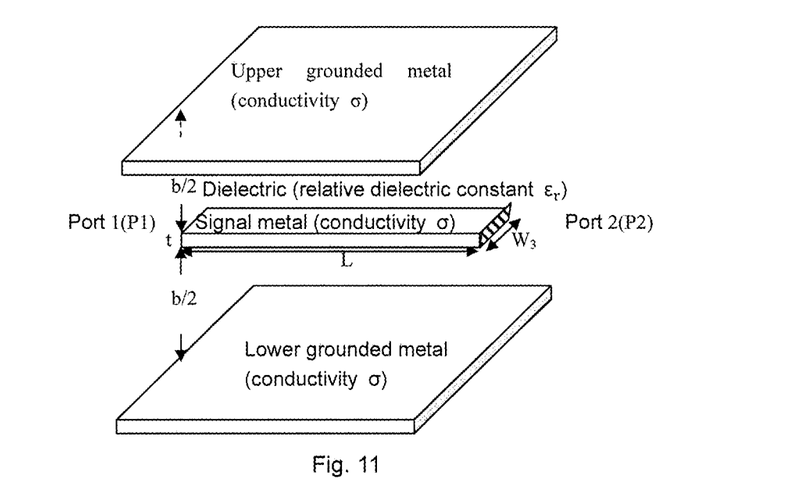
FIG. 11 is a schematic view of a Thru 3 (T3) on-wafer de-embedding dummy in Implementation 2.
Figure 12:
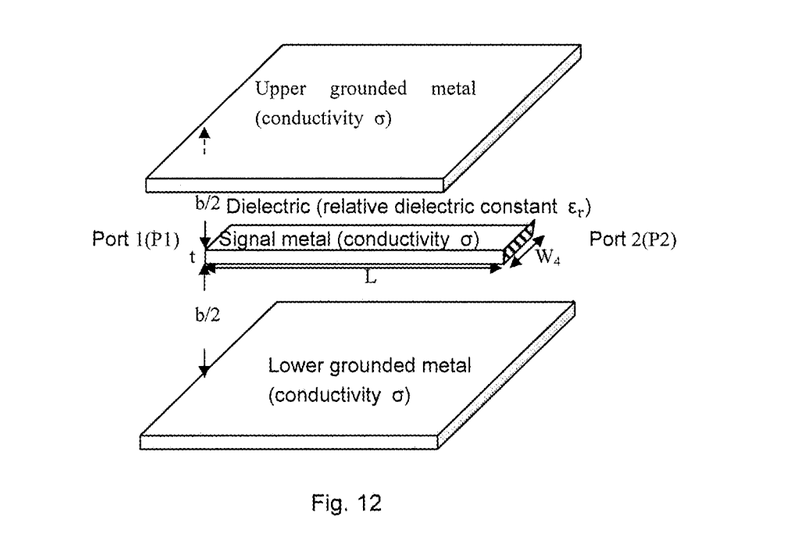
FIG. 12 is a schematic view of a Thru 4 (T4) on-wafer de-embedding dummy in Implementation 2.

As can be seen, $Y_A$ as the left side of the Equation(2) can be obtained as long as that the right side of Equation (2) is known after the measured value of $Y_M$ is substituted. That is, the intrinsic high frequency characterization measurement result $Y_A$ of the DUT is obtained by stripping all the on-wafer parasitics from the raw data of the whole high frequency characterization measurement $Y_M$ of the DUT, achieving the purpose of the high frequency characterization measurement de-embedding. Therefore, total 16 elements of the four Y-parameter 2×2 admittance matrices $Y_{ee}$, $Y_{ii}$, $Y_{ei}$ and $Y_{ie}$ for describing said parasitic four-port network need to be determined. A proper equation set, which is composed of equations obtained by applying Equation(1) to a sufficient number of on-wafer de-embedding dummies with both measured $Y_M$ and theoretical $Y_A$ known, can be solved for the said 16 matrix element. Accordingly, for the general four-port method, five two-port on-wafer de-embedding dummies are usually adopted, i.e., Open O, Short S, Left L, Right R, and Thru T, the equivalent circuits of which are shown in FIG. 3. where their corresponding intrinsic two-port Y-parameter admittance matrices are respectively:

$$Y_{AO} = \begin{bmatrix} 0 & 0 \\ 0 & 0 \end{bmatrix} \quad (3)$$

$$Y_{AS} = \begin{bmatrix} \infty & 0 \\ 0 & \infty \end{bmatrix} \quad (4)$$

$$Y_{AL} = \begin{bmatrix} Y_L & 0 \\ 0 & 0 \end{bmatrix} = \begin{bmatrix} G_L + j\omega C_L & 0 \\ 0 & 0 \end{bmatrix} \quad (5)$$

$$Y_{AR} = \begin{bmatrix} 0 & 0 \\ 0 & Y_R \end{bmatrix} = \begin{bmatrix} 0 & 0 \\ 0 & G_R + j\omega C_R \end{bmatrix} \quad (6)$$

$$Y_{AT} = \begin{bmatrix} s & -t \\ -t & s \end{bmatrix} \quad (7)$$

Respectively substituting Equations (3)-(7) into Equation (1) obtains an equation set formed of an enough number of equations. After solving said equation set, by using Equation (2), the intrinsic Y-parameter admittance matrix $Y_A$ of the DUT can be calculated from the measured whole Y-parameter admittance matrix $Y_M$ of the DUT, i.e., the high frequency de-embedding for stripping said on-wafer parasitics is completed. Specifically, if said parasitic four-port network is passive and contains no any anisotropic material, and further more specifically, if said parasitic four-port network is symmetrical, the number of such on-wafer de-embedding dummies may be decreased to four, even three, as needed. In this way, the complexity and workload of de-embedding related testing structure designs, wafer fabrication, testing and data processing can be effectively decreased.

As described above, said general four-port high frequency de-embedding method is to further shift the test reference planes to input and output ports of the DUT, respectively, on the basis of off-wafer calibration in which the test reference planes are moved from the VNA to the tips of the on-wafer testing probes by using a suite of ISS calibration dummies. Actually, said general four-port high frequency de-embedding method is also suitable for directly moving the test reference planes from VNA to input and output ports of the DUT, without requiring off-wafer calibration based on the ISS calibration dummies, and this is called one-step calibration method. However, in doing this, the premise is that it is necessary to change, in the general four-port network as shown in FIG. 2, the definition of location of P0 from the tip of the input testing probe to the input testing port of the VNA and the definition of location of P3 from the tip of the output testing probe to the output testing port of the VNA, while maintaining the definition of locations of P1 and P2 as the input terminal of the DUT and the output terminal of the DUT. It is to be declared here that the general four-port on-wafer high frequency de-embedding method involved in the present invention may be applicable to on-wafer de-embedding after the completion of off-wafer calibration based on the ISS calibration dummies, and also may be used, as the one-step calibration method, in on-wafer de-embedding which directly moves the high frequency test reference planes directly from VNA to the input and output ports of the DUT without requiring off-wafer calibration based on the ISS calibration dummies.

The general four-port high frequency de-embedding method has the following advantages: the starting points and end points, from and to which, respectively, the test input and output reference planes need to move, are defined as ports of a general four-port network, respectively, and in this way, all the on-wafer parasitics to be stripped in de-embedding are contained in said general four-port network, without making any assumptions on the specific form of the interior structure of said general four-port network containing all the parasitics, and hence, the universality of said de-embedding technique is ensured. However, a problem with the prior art of said general four-port high frequency de-embedding method is that idealized assumption is made on the network characteristics of the required two-port on-wafer de-embedding dummies, and those idealized on-wafer de-embedding dummies are actually unachievable in reality, and consequently, errors are inevitably introduced. Specifically, this is first manifested in Open and Short dummies. Referring to Equations (3) and (4), ideal Open requires $y_{11}=y_{22}=0$ for $Y_{AO}$ and ideal Short requires $y_{11}=y_{22}=\infty$(infinite) for $Y_{AS}$. Meanwhile, ideal Open and ideal Short further require that there is no any coupling between the input port and the output port, and hence, for both $Y_{AO}$ and $Y_{AS}$, $y_{12}=y_{21}=0$. However, actually, on-wafer Open and Short dummies are non-ideal no matter how they are designed and fabricated. Due to the presence of parasitics (for example, parasitic resistances, parasitic capacitances, parasitic inductances or the like), the admittances ($y_{11}$ and $y_{22}$ of $Y_{AO}$) of the actual Open are not equal to 0 and the admittances ($y_{11}$ and $y_{22}$ of $Y_{AS}$) of the actual Short are not infinite, either, and also coupling inevitably exists between the input port and the output port of the actual Open and Short dummies, and hence, for both $Y_{AO}$ and $Y_{AS}$, $y_{12}$ and $y_{21}$ are not strictly equal to 0, either. Secondly, with regard to the Left and Right dummies, the prior art of the general four-port high frequency de-embedding is implemented by connecting conductors $G_L$ and $G_R$ to the input port and the output port, respectively, on the basis of the Open dummy. Although, as shown in FIGS. 3 (c)-(d) and Equations (5) and (6), the prior art also takes into account parasitic capacitances $C_L$ and $C_R$ connected in parallel with $G_L$ and $G_R$ to form access admittances $Y_L$ and $Y_R$ of the Left and Right dummies, respectively, determined by the distributed nature of high frequency operation, particularly as the operating frequency is increased from radio frequency and microwave band to millimeter wave band, artificially-designed conductors (i.e., resistors) cannot, once fabricated on a wafer, be strictly and accurately described only by a simple lumped equivalent circuit having conductors (resistors) and capacitors connected in parallel. That is, forcibly setting $y_{11}$ and $y_{22}$ of $Y_{AC}$ and $Y_{AR}$ to be respectively equal to $G_L+j\omega C_L$ and $G_R+j\omega C_R$ does not accord with the fact. AgOn, since the Left and Right dummies are built based on the Open dummy, the non-ideal characteristic problem with the actual Open dummy as described above still exists here. As a result, simply zeroing $y_{12}$, $y_{21}$ and $y_{22}$ of $Y_{AL}$ and $y_{11}$, $y_{12}$ and $y_{21}$ of $Y_{AR}$ in Equations (5) and (6), respectively, inevitably causes corresponding errors.

SUMMARY OF THE PRESENT INVENTION

In order to overcome this problem, the present invention provides an improved general four-port on-wafer high frequency de-embedding method which is still based on the general parasitic four-port theory as described above. However, no idealized lumped assumption is made on the necessary on-wafer de-embedding dummies. Instead, by using the distributive theoretical calculation or simulation results in combination with the corresponding high frequency characterization measurement data, the de-embedding of on-wafer DUT high frequency characterization measurement data is finally completed by optimizing and calibrating corresponding calculation or simulation results. On the basis of inheriting the advantage of the universality the prior art of the general four-port high frequency de-embedding has that all the on-wafer parasitics to be stripped are contained in said general four-port network without any assumption on the specific form of the interior structure of said network, the present invention gives full consideration to the non-ideal nature of the practically fabricated on-wafer de-embedding dummies. No idealized lumped assumption is made on the necessary on-wafer de-embedding dummies as in the prior art, and the universality of the prior art of general four-port high frequency de-embedding is inherited and further developed.

In order to achieve this purpose, a general four-port on-wafer high frequency de-embedding method is provided, including the following steps:

1.1: fabricating, together with a device under test (DUT) to be de-embedded, N on-wafer de-embedding dummies;

1.2: measuring to obtain the whole Y-parameter admittance matrix $Y_M$ of said DUT and the whole Y-parameter admittance matrix $Y_{Mj}$ (j=1,2, . . . , N) of each of said on-wafer de-embedding dummies;

1.3: for each on-wafer de-embedding dummy, building a model considering the distributed nature of high frequency characteristics of the on-wafer de-embedding dummy;

1.4: obtaining the intrinsic Y-parameter admittance matrix $Y_{Aj}(p_1, p_2, \ldots p_M)$ (j=1,2, . . . , N) of said N on-wafer de-embedding dummies by calculation or simulation by using said models, where, $p_1, p_2, \ldots, p_M$ are M model parameters of said models on which said calculation or simulation is based, and $4N-16 \geq M$;

1.5: solving an equation set $Y_{Mj}=Y_{ee}-Y_{ei}$ $(Y_{Aj}(p_1, p_2, \ldots p_M)+Y_{ii})^{-1}Y_{ie}(j=1,2, \ldots, N)$ for elements of four sub-matrices $Y_{ee}, Y_{ii}, Y_{ei}$ and $Y_{ie}$ of the admittance matrix Y of said parasitic four-port network to be stripped in de-embedding and said model parameters $p_1, p_2, \ldots, p_M$ as unknowns, wherein, as shown in the following equation, $Y_{ee}, Y_{ii}, Y_{ei}$ and $Y_{ie}$ as four sub-matrices, form the admittance matrix Y of said parasitic four-port network:

$$Y = \begin{bmatrix} Y_{ee} & Y_{ei} \\ Y_{ie} & Y_{ii} \end{bmatrix}$$

1.6: substituting $Y_{ee}, Y_{ii}, Y_{ei}$ and $Y_{ie}$ obtained in Step 1.5 and the whole Y-parameter admittance matrix $Y_M$ of said DUT obtained by measurement in Step 1.2 into Equation $Y_A=Y_{ii}-Y_{ie}(Y_M-Y_{ee})^{-1}Y_{ei}$, to obtain by calculation the intrinsic Y-parameter admittance matrix $Y_A$ of said DUT.

Solving the equation set $Y_{Mj}=Y_{ee}-Y_{ei}$ $(Y_{Aj}(p_1, p_2, p_M)+Y_{ii})^{-1} Y_{ie}$ $(j=1,2, \ldots, N)$ for the elements of four sub-matrixes $Y_{ee}, Y_{ii}, Y_{ei}$ and $Y_{ie}$ of the admittance matrix Y of said parasitic four-port network to be stripped in de-embedding and said model parameters $p_1, p_2, \ldots, p_M$ as unknowns in Step 1.5 comprises the following steps:

2.1: assigning initial values to said model parameters $p_1, p_2, \ldots p_M$, respectively;

2.2: obtaining the value of $Y_{Aj}(p_1, p_2, \ldots p_M)$ $(j=1,2, \ldots, N)$ by calculation or simulation by using the assigned model parameters $p_1, p_2, \ldots p_M$;

2.3: after solving an equation set $Y_{Mj}=Y_{ee}-Y_{ei}$ $(Y_{Aj}(p_1, p_2, \ldots p_M)+Y_{ii})^{-1} Y_{ie}(j=1,2,3,4)$ by using the known measured values $Y_{Mj}(j=1,2,3,4)$ of the first four on-wafer de-embedding dummies and said calculated or simulated values $Y_{Aj}(p_1, p_2, \ldots p_M)(j=1,2,3,4)$ to obtain the values of $Y_{ee}, Y_{ii}, Y_{ei}$ and $Y_{ie}$, substituting the known measured values $Y_{Mj}(j=5,6, \ldots, N)$ of the remaining on-wafer de-embedding dummies and said solved values of $Y_{ee}, Y_{ii}, Y_{ei}$ and $Y_{ie}$, into $Y_{Dj}=-Y_{ii}-Y_{ie}(Y_{Mj}-Y_{ee})^{-1}Y_{ei}$ $(j=5,6, \ldots, N)$ to obtain by calculation the de-embedded Y-parameter admittance matrices $Y_{Dj}(j=5,6, \ldots, N)$ of said remaining on-wafer de-embedding dummies;

2.4: comparing the calculated $Y_{Dj}(j=5,6, \ldots, N)$ with the calculated or simulated values $Y_{Aj}(p_1, p_2, \ldots p_M)$ $(j=5,6, \ldots, N)$ of the corresponding remaining on-wafer de-embedding dummies already obtained in Step 2.2, determining final values for said undetermined model parameters $p_1, p_2, \ldots p_M$ which are necessary for the calculation or simulation of the on-wafer de-embedding dummies, if a difference between the two meets the set error standard, and correcting the values of the said model parameters $p_1, p_2, \ldots p_M$ and reassigning them, respectively, and then turning back to Step 2.2, if the difference between the two does not meet the set error standard.

In order to achieve this purpose, a general four-port on-wafer high frequency de-embedding method for the four-port network of passivity, reciprocity and symmetry is provided, including the following steps:

3.1: fabricating, together with a device under test (DUT) to be de-embedded, N on-wafer de-embedding dummies of passivity, reciprocity and symmetry;

3.2: measuring to obtain the whole Y-parameter admittance matrix $Y_M$ of said DUT and the whole Y-parameter admittance matrix $Y_{Mj}$ $(j=1,2, \ldots, N)$ of each of said on-wafer de-embedding dummies;

3.3: for each on-wafer de-embedding dummy, building a model considering the distributed nature of high frequency characteristics of the on-wafer de-embedding dummy;

3.4: obtaining the intrinsic Y-parameter admittance matrices $Y_{Aj}(p_1, p_2, \ldots p_M)$ $(j=1,2, \ldots, N)$ of said N on-wafer de-embedding dummies by calculation or simulation by using said models, where, $p_1, p_2, \ldots, p_M$ are M model parameters of models on which said calculation or simulation is based, and $2N-6 \geq M$;

3.5: solving an equation set $Y_{Mj}=Y_{ee}-Y_{ei}(Y_{Aj}(p_1, p_2, \ldots p_M)+Y_{ii})^{-1}Y_{ei}(j=1,2, \ldots, N)$ for the elements of the three sub-matrices $Y_{ee}, Y_{ii}$ and $Y_{ei}$ of the admittance matrix Y of said parasitic four-port network to be stripped in de-embedding and said model parameters $p_1, p_2, \ldots, p_M$ as unknowns, wherein, as shown in the following equation, $Y_{ee}, Y_{ii}$, and $Y_{ei}$, as three sub-matrices, form the admittance matrix Y of said parasitic four-port network:

$$Y = \begin{bmatrix} Y_{ee} & Y_{ei} \\ Y_{ie} & Y_{ii} \end{bmatrix};$$

and 3.6: substituting $Y_{ee}, Y_{ii}$ and $Y_{ei}$ obtained in Step 3.5 and the whole Y-parameter admittance matrix $Y_M$ of said DUT obtained by measurement in Step 3.2 into Equation $Y_A=-Y_{ii}-Y_{ei}(Y_M-Y_{ee})^{-1}Y_{ei}$, to obtain by calculation the intrinsic Y-parameter admittance matrix $Y_A$ of said DUT.

Solving the equation set $Y_{Mj}=Y_{ee}-Y_{ei}(Y_{Aj}(p_1, p_2, \ldots p_M)+Y_{ii})^{-1} Y_{ei}$ $(j=1,2, \ldots, N)$ for the elements of the three sub-matrices $Y_{ee}, Y_{ii}$ and $Y_{ei}$ of the admittance matrix Y of said parasitic four-port network to be stripped in de-embedding and said model parameters $p_1, p_2, \ldots, p_M$ as unknowns in Step 3.5 comprises the following steps:

4.1: assigning initial values to said model parameters $p_1, p_2, \ldots p_M$, respectively;

4.2: obtaining the values of $Y_{Aj}(p_1, p_2, \ldots p_M)$ $(j=1,2, \ldots, N)$ by calculation or simulation by using the assigned model parameters $p_1, p_2, \ldots p_M$;

4.3: after solving an equation set $Y_{Mj}=Y_{ee}-Y_{ei}(Y_{Aj}(p_1, p_2, \ldots p_M)+Y_{ii})^{-1} Y_{ei}$ $(j=1,2,3)$ by using the known test values $Y_{Mj}(j=1,2,3)$ of the first three on-wafer de-embedding dummies and said calculated or simulated values $Y_{Aj}(p_1, p_2, \ldots p_M)$ $(j=1,2,3)$ to obtain the values of $Y_{ee}, Y_{ii}$ and $Y_{ei}$ (it is unnecessary to completely solve $Y_{ei}$, referring to claim 5.4), substituting the known test values $Y_{Mj}(j=4,5, \ldots, N)$ of the remaining on-wafer de-embedding dummies and said obtained values of $Y_{ee}, Y_{ii}$ and $Y_{ei}$ into $Y_{Dj}=-Y_{ii}-Y_{ei}(Y_{Mj}-Y_{ee})^{-1}Y_{ei}$ $(j=4,5, \ldots, N)$ to obtain by calculation the de-embedded Y-parameter admittance matrices $Y_{Dj}$ $(j=4,5, \ldots, N)$ of said remaining on-wafer de-embedding dummies;

4.4: comparing the calculated $Y_{Dj}(j=4,5, \ldots, N)$ with the calculated or simulated values $Y_{Aj}(p_1, p_2, \ldots p_M)$ $(j=4,5, \ldots, N)$ of the corresponding remaining on-wafer de-embedding dummies already obtained in Step 4.2, determining final values for undetermined model parameters $p_1, p_2, \ldots p_M$ which are necessary for the calculation or simulation of the on-wafer de-embedding dummies, if a difference between the two meets the set error standard, and correcting the values of the model parameters $p_1, p_2, \ldots p_M$ and reassigning them, and then turning back to Step 4.2, if the difference between the two does not meet the set error standard.

Solving the equation set $Y_{Mj} = Y_{ee} - Y_{ei}(Y_{Aj}(p_1, p_2, \ldots p_M) + Y_{ii})^{-1} Y_{ie}$ (j=1,2,3) to further obtain by calculation the de-embedded Y-parameter admittance matrices $Y_{Dj}$ (j=4,5,..., N) of said remaining on-wafer de-embedding dummies in Step 4.3 comprises the following steps:

5.1: obtaining by calculation matrices $Z_{2A} = (Y_{A2} - Y_{A1})^{-1}$, $Z_{2M} = (Y_{M2} - Y_{M1})^{-1}$, $Z_{3A} = (Y_{A3} - Y_{A1})^{-1}$ and $Z_{3M} = (Y_{M3} - Y_{M1})^{-1}$, where exponent $-1$ represents matrix inversion;

5.2: calculating quantities $$r_{2p} = \frac{z_{2A11} + z_{2A12}}{z_{2M11} + z_{2M12}}, \quad r_{3p} = \frac{z_{3A11} + z_{3A12}}{z_{3M11} + z_{3M12}}, \quad r_{2M} = \frac{z_{2A11} - z_{2A12}}{z_{2M11} - z_{2M12}},$$

$$r_{3m} = \frac{z_{3A11} - z_{3A12}}{z_{3M11} - z_{3M12}},$$

$$y_p = \frac{r_{3p}(y_{A311} + y_{A312}) - r_{2p}(y_{A211} + y_{A212})}{r_{2p} - r_{3p}},$$

$$y_m = \frac{r_{3m}(y_{A311} - y_{A312}) - r_{2m}(y_{A211} - y_{A212})}{r_{2m} - r_{3m}},$$

$x_p = r_{2p}(y_p + y_{A111} + y_{A112})(y_p + y_{A211} + y_{A212})$ and $x_m = r_{2m}(y_m + y_{A111} - y_{A112})(y_m + y_{A211} - y_{A212})$, where $z_{2A11}$ and $z_{2A12}$ are respectively $z_{11}$ and $z_{12}$ of $Z_{2A}$; $z_{2M11}$ and $z_{2M12}$ are respectively $z_{11}$ and $z_{12}$ of $Z_{2M}$; $z_{3A11}$ and $z_{3A12}$ are respectively $z_{11}$ and $z_{12}$ of $Z_{3A}$; $z_{3M11}$ and $z_{3M12}$ are respectively $z_{11}$ and $z_{12}$ of $Z_{3M}$; $y_{A111}$ and $y_{A112}$ are respectively $y_{11}$ and $y_{12}$ of $Y_{A1}$; $y_{A211}$ and $y_{A212}$ are respectively $y_{11}$ and $y_{12}$ of $Y_{A2}$; $y_{A311}$ and $y_{A312}$ are respectively $y_{11}$ and $y_{12}$ of $Y_{A3}$;

5.3: calculating quantities $$y_{ii11} = \frac{y_p + y_m}{2} \text{ and } y_{ii12} = \frac{y_p - y_m}{2}$$

to obtain the matrix $$Y_{ii} = \begin{bmatrix} y_{ii11} & y_{ii12} \\ y_{ii12} & y_{ii11} \end{bmatrix};$$

5.4: obtaining by calculation the square of elements $y_{11}$ and $y_{12}$ of the matrix $Y_{ei}$:

$$y_{ei11}^2 = \frac{x_p + x_m \pm 2\sqrt{x_p x_m}}{4} \text{ and } y_{ei12}^2 = \frac{x_p + x_m \mp 2\sqrt{x_p x_m}}{4},$$

where the plus-minus sign is selected such that, at the low frequency limit, $y_{ei11}^2$ tends to infinity and $y_{ei12}^2$ tends to zero, and both $y_{ei11}^2$ and $y_{ei12}^2$ continuously vary with frequency;

5.5: obtaining by calculation a matrix $Z_{Ai} = (Y_{A1} + Y_{ii})^{-1}$;

5.6: calculating quantities $$y_{Ai11} = z_{Ai11}\frac{x_p + x_m}{2} + z_{Ai12}\frac{x_p - x_m}{2} \text{ and }$$

$$y_{Ai12} = z_{Ai12}\frac{x_p + x_m}{2} + z_{Ai11}\frac{x_p - x_m}{2}$$

to obtain a matrix $$Y_{Ai} = \begin{bmatrix} y_{Ai11} & y_{Ai12} \\ y_{Ai12} & y_{Ai11} \end{bmatrix},$$

where $z_{Ai11}$ and $z_{Ai12}$ are respectively $z_{11}$ and $z_{12}$ of $Z_{Ai}$;

5.7: obtaining by calculation the matrix $Y_{ee} = Y_{M1} + Y_{Ai}$;

5.8: obtaining by calculation a matrix $Z_{Mej} = (Y_{ee} - Y_{Mj})^{-1}$ (j=4,5,..., N);

5.9: calculating quantities $$y_{Mej11} = z_{Mej11}y_{ei11}^2 + (z_{Mej12} + z_{Mej21})\frac{x_p - x_m}{4} + z_{Mej22}y_{ei12}^2 (j = 4, 5, \ldots, N),$$

$$y_{Mej12} = z_{Mej12}y_{ei11}^2 + (z_{Mej11} + z_{Mej22})\frac{x_p - x_m}{4} + z_{Mej21}y_{ei12}^2 (j = 4, 5, \ldots, N),$$

$$y_{Mej21} = z_{Mej21}y_{ei11}^2 + (z_{Mej11} + z_{Mej22})\frac{x_p - x_m}{4} + z_{Mej12}y_{ei12}^2 (j = 4, 5, \ldots, N) \text{ and}$$

$$y_{Mej22} = z_{Mej22}y_{ei11}^2 + (z_{Mej12} + z_{Mej21})\frac{x_p - x_m}{4} + z_{Mej11}y_{ei12}^2 (j = 4, 5, \ldots, N)$$

to obtain a matrix $$Y_{Mej} = \begin{bmatrix} y_{Mej11} & y_{Mej12} \\ y_{Mej21} & y_{Mej22} \end{bmatrix} (j = 4, 5, \ldots, N),$$

where $z_{Mej11}, z_{Mej12}, z_{Mej21}$ and $z_{Mej22}$ are respectively $z_{11}, z_{12}, z_{21}$ and $z_{22}$ of $Z_{Mej}$; and 5.10: obtaining by calculation the de-embedded Y-parameter matrix $Y_{Dj} = Y_{Mej} - Y_{ii}$ (j=4,5,..., N) of said remaining on-wafer de-embedding dummies.

Calculating the intrinsic Y-parameter admittance matrix $Y_A$ of said DUT by using the whole Y-parameter admittance matrix $Y_M$ of said DUT obtained by measurement in Step 3.6 comprises the following steps:

6.1: obtaining by calculation a matrix $Z_{Me} = (Y_{ee} - Y_M)^{-1}$;

6.2: calculating quantities $$y_{Me11} = z_{Me11}y_{ei11}^2 + (z_{Me12} + z_{Me21})\frac{x_p - x_m}{4} + z_{Me22}y_{ei12}^2,$$

$$y_{Me12} = z_{Me12}y_{ei11}^2 + (z_{Me11} + z_{Me22})\frac{x_p - x_m}{4} + z_{Me21}y_{ei12}^2,$$

$$y_{Me21} = z_{Me21}y_{ei11}^2 + (z_{Me11} + z_{Me22})\frac{x_p - x_m}{4} + z_{Me12}y_{ei12}^2 \text{ and}$$

$$y_{Me22} = z_{Me22}y_{ei11}^2 + (z_{Me12} + z_{Me21})\frac{x_p - x_m}{4} + z_{Me11}y_{ei12}^2$$

to obtain a matrix $$Y_{Me} = \begin{bmatrix} y_{Me11} & y_{Me12} \\ y_{Me21} & y_{Me22} \end{bmatrix},$$

where $z_{Me11}, z_{Me12}, z_{Me21}$ and $z_{Me22}$ are respectively $z_{11}, z_{12}, z_{21}$ and $z_{22}$ of $Z_{Me}$; and 6.3: obtaining by calculation the intrinsic Y-parameter admittance matrix $Y_A=Y_{Me}-Y_{ii}$ of said DUT to be de-embedded.

On the basis of inheriting such a universality that the existing technology of universal four-port high frequency de-embedding contains all parasitic parameters to be stripped in said universal four-port network without any assumption on the specific form of the interior structure of said network, the present invention gives full consideration to the non-ideal essence of the practically needed de-embedding co-testing structures. No lumped and idealized assumption is made on the necessary de-embedding co-testing structures as in the prior art, and the universality of the existing technology of universal four-port high frequency de-embedding is inherited and further developed.

DETAILED DESCRIPTION OF THE PRESENT INVENTION

Implementation 1: one implementation of a general four-port on-wafer high frequency de-embedding method for a case in which parasitics to be stripped form a general parasitic four-port network (1) Five on-wafer de-embedding dummies are designed and fabricated together with a device under test (DUT) to be de-embedded, i.e., five on-wafer de-embedding two-port dummies generally adopted in the prior art of the general four-port on-wafer high frequency de-embedding method, including: Open (O), Short (S), Left (L), Right (R) and strip-line Thru (T). However, no assumption is made on the form of their equivalent circuits as in FIG. 3. Instead, they are all considered as a general two-port network. Their schematic structural diagrams are respectively as shown in FIGS. 4, 5, 6, 7 and 8, wherein a lower grounded metal, an intermediate signal wire metal, and an upper grounded metal of the strip-line Thru T are respectively made of three layers of metal in the multi-layer metal interconnection process of a semiconductor integrated circuit, and a dielectric layer is filled between the lower grounded metal and the upper grounded metal and surrounds said signal wire metal; the signal wire is removed from the strip-line Thru T dummy to obtain an Open dummy O; the input and output ports of the Open dummy O are connected to the lower grounded metal and the upper grounded metal, respectively, by a via/metal stack, to obtain a Short dummy S; the input port of the Open dummy O is connected to the lower grounded metal and the upper grounded metal by a via/metal stack to obtain a Left dummy L; the output port of the Open structure O is connected to the lower grounded metal and the upper grounded metal by a via/metal stack to obtain a Right dummy L.

(2) By an on-wafer high frequency measurement instruments and techniques, the whole Y-parameter admittance matrix $Y_M$ of said DUT and the whole Y-parameter admittance matrices, which are respectively denoted by $Y_{MO}$, $Y_{MS}$, $Y_{ML}$, $Y_{MR}$ and $Y_{MT}$, of said five on-wafer de-embedding dummies are obtained by measurement.

(3) In the premise of giving consideration to the distributive nature of high frequency characteristics of said on-wafer de-embedding dummies, models for said Open (O), Short (S), Left (L), Right (R) and Thru (T) are built in a passive electromagnetic field simulation software environment, respectively, according to structures as shown in FIGS. 4, 5, 6, 7 and 8, and electromagnetic field simulation is performed by said passive electromagnetic field simulation software on the basis of the built models to obtain intrinsic Y-parameter admittance matrices of said five on-wafer de-embedding dummies, which are respectively denoted by $Y_{AO}(\sigma, \in_r)$, $Y_{AS}(\sigma, \in_r)$, $Y_{AL}(\sigma, \in_r)$, $Y_{AR}(\sigma, \in_r)$ and $Y_{AT}(\sigma, \in_r)$, where, $\sigma$ and $\in_r$, as model parameters of models on which said simulation is based, are respectively the conductivity of metals in said high frequency on-wafer de-embedding dummies and the relative dielectric constant of the dielectric layer material filled among the metals.

(4) An equation set $Y_{Mj}=Y_{ee}-Y_{ei}(Y_{Aj}(\sigma, \in_r)+Y_{ii})^{-1}Y_{ie}$ (j=O,S,L,R,T) is solved for the elements of the related admittance matrixes $Y_{ee}$, $Y_{ii}$, $Y_{ei}$ and $Y_{ie}$ of the parasitic four-port network to be stripped in de-embedding and said model parameters $\sigma$ and $\in_r$ as unknowns. Specifically, the following steps are included:

(4-1) on the basis that initial default values are taken for the model parameters $\sigma$ and $\in_r$ respectively, obtaining the values of $Y_{Aj}(\sigma, \in_r)$(j=O, S, L, R, T) by passive electromagnetic field simulation;

(4-2) after solving an equation set $Y_{Mj}=Y_{ee}-Y_{ei}(Y_{Aj}(\sigma, \in_r)+Y_{ii})^{-1}Y_{ie}$ (j=O, S, L, R) by using the known measurement values $Y_{Mj}$ (j=O, S, L, R) of the first four on-wafer de-embedding dummies and said simulated values $Y_{Aj}(\sigma, \in_r)$(j=O,S, L, R) to obtain the values of $Y_{ee}$, $Y_{ii}$, $Y_{ei}$ and $Y_{ie}$, substituting the known measurement values $Y_{MT}$ of the strip-line Thru T and said obtained values of $Y_{ee}$, $Y_{ii}$, $Y_{ei}$ and $Y_{ie}$ into $Y_{DT}=-Y_{ii}-Y_{ie}(Y_{MT}-Y_{ee})^{-1}Y_{ei}$ to obtain by calculation the de-embedded Y-parameter admittance matrix $Y_{DT}$ of the strip-line Thru T;

(4-3) comparing the calculated $Y_{DT}$ with the simulated value $Y_{AT}(\sigma, \in_r)$ of the strip-line Thru T already obtained in Step (4-1), properly correcting the values of the model parameters $\sigma$ and $\in_r$, and then turning back to Step (4-1) if the difference between the two does not meet the set error standard, and obtaining the values of $Y_{Aj}(\sigma,\in_r)$(j=O, S, L, R, T) again by passive electromagnetic field simulation by using the corrected model parameters; and (4-4) once turning back to Step (4-1), starting a cyclic iterative fitting process from Step (4-1) to Step (4-3), performing iterative optimization fitting by optimization algorithms such as inverse modeling, and continuously correcting the values of the model parameters $\sigma$ and $\in_r$ used for simulation of intrinsic Y-parameter admittance matrices of the on-wafer de-embedding dummies until a difference between the de-embedded Y-parameter admittance matrix $Y_{DT}$ of the strip-line Thru T and the corresponding simulated value $Y_{AT}(\sigma, \in_r)$ meets a set error standard, that is, determining the final values for the undetermined mode parameters $\sigma$ and $\in_r$ which are necessary for the simulation of the on-wafer de-embedding dummies by this iterative fitting between $Y_{DT}$ and $Y_{AT}(\sigma, \in_r)$.

(5) The solved $Y_{ee}$, $Y_{ii}$, $Y_{ei}$ and $Y_{ie}$ and the whole Y-parameter admittance matrix $Y_M$ of said DUT obtained by measurement are substituted into the right side of $Y_A = -Y_{ii} - Y_{ie}(Y_M - Y_{ee})^{-1} Y_{ei}$ to complete said general four-port on-wafer high frequency de-embedding. That is, the intrinsic Y-parameter admittance matrix $Y_A$ of said DUT is calculated by using the whole Y-parameter admittance matrix $Y_M$ of said DUT obtained by measurement.

Implementation 2: one implementation of a general four-port on-wafer high frequency de-embedding method for a case in which all the on-wafer parasitics to be stripped form a parasitic four-port network of passivity, reciprocity and symmetry.

(1) Four on-wafer strip-line Thru de-embedding dummies of passivity, reciprocity and symmetry and different in width are designed and fabricated together with a device under test (DUT) to be de-embedded, i.e., Thru 1, Thru 2, Thru 3 and Thru 4 which are respectively denoted by T1, T2, T3 and T4. Their schematic structure diagrams are respectively as shown in FIGS. 9, 10, 11 and 12, wherein said strip-line Thru signal wires have widths of $W_1$, $W_2$, $W_3$ and $W_4$, respectively, but they all have the same length of L, and they all have the same thickness of t. The dielectric layers between the signal wires and the upper and the lower grounded metals have the same thickness of b/2.

(2) By using on-wafer high frequency measurement instruments and techniques, the whole Y-parameter admittance matrix $Y_M$ of said DUT and the whole Y-parameter admittance matrices $Y_{Mj}$ (j=1,2,3,4) of said four on-wafer strip-line Thru de-embedding dummies are obtained by measurement.

(3) In the premise of giving consideration to the distributive nature of high frequency characteristics of said on-wafer de-embedding dummies, analytical models for said four on-wafer strip-line Thru de-embedding dummies are built, respectively, and following intrinsic Y-parameter admittance matrices of said four Thru de-embedding dummies are calculated by the built models:

$$Y_{Aj}(\sigma, \varepsilon_r) = \begin{bmatrix} y_{Aj11}(\sigma, \varepsilon_r) & y_{Aj12}(\sigma, \varepsilon_r) \\ y_{Aj12}(\sigma, \varepsilon_r) & y_{Aj11}(\sigma, \varepsilon_r) \end{bmatrix},$$

$$y_{Aj11}(\sigma, \varepsilon_r) =$$

$$\frac{(W_j + 0.441b)\sqrt{\epsilon_r}}{30\pi b \tanh\left\{\frac{0.0027bL}{(b-t)(W_j + 0.441b)}\left[1 + \frac{2W_j}{b-t} + \frac{1b+t}{\pi b-t}\ln\left(\frac{2b-t}{t}\right)\right]\right\}\sqrt{\frac{\pi\epsilon_r\mu_0 f}{\sigma}} + j\frac{2\pi fL\sqrt{\epsilon_r}}{c}}$$

-continued $$y_{Aj12}(\sigma, \varepsilon_r) =$$

$$-\frac{(W_j + 0.441b)\sqrt{\epsilon_r}}{30\pi b \sinh\left\{\frac{0.0027bL}{(b-t)(W_j + 0.441b)}\left[1 + \frac{2W_j}{b-t} + \frac{1b+t}{\pi b-t}\ln\left(\frac{2b-t}{t}\right)\right]\right\}\sqrt{\frac{\pi\epsilon_r\mu_0 f}{\sigma}} + j\frac{2\pi fL\sqrt{\epsilon_r}}{c}}$$

$(j = 1, 2, 3, 4)$, where, $\sigma$ and $\in_r$, as model parameters of models on which said calculation is based, are respectively the conductivity of metals in the on-wafer Thru de-embedding dummies and the relative dielectric constant of the dielectric material, $\mu_0 = 4\pi \times 10^{-7}$H/m is the permeability of vacuum, f is the frequency of test and simulation, and $c = 3 \times 10^8$ m/s. is the speed of light in vacuum.

(4) An equation set $Y_{Mj} = Y_{ee} - Y_{ei}(Y_{Aj}(\sigma, \in_r) + Y_{ii})^{-1} Y_{ei}$ (j=1,2,3,4) is solved for the elements of the related admittance matrixes $Y_{ee}$, $Y_{ii}$ and $Y_{ei}$ of the parasitic four-port network to be stripped in de-embedding and said model parameters $\sigma$ and $\in_r$ as unknowns. Specifically, the following steps are included:

(4-1) on the basis that the initial default values are taken for the model parameters $\sigma$ and $\in_r$ respectively, obtaining the values of $Y_{Aj}(\sigma, \in_r)$ (j=1,2,3,4) by calculation;

(4-2) after solving an equation set $Y_{Mj} = Y_{ee} - Y_{ei}(Y_{Aj}(\sigma, \in_r) + Y_{ii})^{-1} Y_{ei}$ (j=1,2,3) by using the known measurement values $Y_{Mj}$ (j=1,2,3) of the three de-embedding dummies T1, T2 and T3 and said calculated values $Y_{Aj}(\sigma, \in_r)$ (j=1,2,3) to obtain the values of $Y_{ee}$, $Y_{ii}$ and $Y_{ei}$ (it is unnecessary to completely solve $Y_{ei}$, as long as the square of its elements is obtained), substituting the known measurement value $Y_{M4}$ of the T4 de-embedding dummy and said obtained values of $Y_{ee}$, $Y_{ii}$ and $Y_{ei}$ into the right side of $Y_{D4} = -Y_{ii} - Y_{ei}(Y_{M4} - Y_{ee})^{-1} Y_{ei}$ to obtain by calculation the de-embedded Y-parameter admittance matrix $Y_{D4}$ of the T4 de-embedding dummy, specifically including the following steps:

(4-2-1) obtaining by calculation matrices $Z_{2A} = (Y_{A2} - Y_{A1})^{-1}$, $Z_{2M} = (Y_{M2} - Y_{M1})^{-1}$, $Z_{3A} = (Y_{A3} - Y_{Aj})^{-1}$ and $Z_{3M} = (Y_{M3} - Y_{M1})^{-1}$, where exponent $-1$ represents matrix inversion;

(4-2-2) calculating quantities $$r_{2p} = \frac{z_{2A11} + z_{2A12}}{z_{2M11} + z_{2M12}}, r_{3p} = \frac{z_{3A11} + z_{3A12}}{z_{3M11} + z_{3M12}}, r_{2m} = \frac{z_{2A11} - z_{2A12}}{z_{2M11} - z_{2M12}},$$

$$r_{3m} = \frac{z_{3A11} - z_{3A12}}{z_{3M11} - z_{3M12}},$$

$$y_p = \frac{r_{3p}(y_{A311} + y_{A312}) - r_{2p}(y_{A211} + y_{A212})}{r_{2p} - r_{3p}},$$

$$y_m = \frac{r_{3m}(y_{A311} - y_{A312}) - r_{2m}(y_{A211} - y_{A212})}{r_{2m} - r_{3m}},$$

$$x_p = r_{2p}(y_p + y_{A111} + y_{A112})(y_p + y_{A211} + y_{A212}) \text{ and }$$

$$x_m = r_{2m}(y_m + y_{A111} - y_{A112})(y_m + y_{A211} - y_{A212}),$$

where $z_{2A11}$ and $z_{2A12}$ are respectively $z_{11}$ and $z_{12}$ of $Z_{2A}$; $z_{2M11}$ and $z_{2M12}$ are respectively and $z_{11}$ and $z_{12}$ of $Z_{2M}$; $z_{3A11}$ and $z_{3A12}$ are respectively $z_{11}$ and $z_{12}$ of $Z_{3A}$; $z_{3M11}$ and $z_{3M12}$ are respectively $z_{11}$ and $z_{12}$ of $Z_{3M}$; $y_{A111}$ and $y_{A112}$ are respectively $y_{11}$ and $y_{12}$ of $Y_{A1}$; $y_{A211}$ and $y_{A212}$ are respectively $y_{11}$ and $y_{12}$ of $Y_{A2}$, $y_{A311}$ and $y_{A312}$ are respectively $y_{11}$ and $y_{12}$ of $Y_{A3}$;

(4-2-3) calculating quantities $$y_{ii11} = \frac{y_p + y_m}{2} \text{ and } y_{ii12} = \frac{y_p - y_m}{2}$$

to obtain the matrix $$Y_{ii} = \begin{bmatrix} y_{ii11} & y_{ii12} \\ y_{ii12} & y_{ii11} \end{bmatrix};$$

(4-2-4) obtaining by calculation the square of elements $y_{11}$ and $y_{12}$ of the matrix $$Y_{ei}: y_{ei11}^2 = \frac{x_p + x_m \pm 2\sqrt{x_p x_m}}{4} \text{ and}$$

$$y_{ei12}^2 = \frac{x_p + x_m \mp 2\sqrt{x_p x_m}}{4},$$

where the plus-minus sign is selected such that, at the low frequency limit, $y_{ei11}^2$ tends to infinity and $y_{ei12}^2$ tends to zero, and both $y_{ei11}^2$ and $y_{ei12}^2$ continuously vary with frequency;

(4-2-5) obtaining by calculation a matrix $Z_{Aj} = (Y_{A1} + Y_{ii})^{-1}$;

(4-2-6) calculating quantities $$y_{Ai11} = z_{Ai11} \frac{x_p + x_m}{2} + z_{Ai12} \frac{x_p - x_m}{2} \text{ and}$$

$$y_{Ai12} = z_{Ai12} \frac{x_p + x_m}{2} + z_{Ai11} \frac{x_p - x_m}{2}$$

to obtain a matrix $$Y_{Ai} = \begin{bmatrix} y_{Ai11} & y_{Ai12} \\ y_{Ai12} & y_{Ai11} \end{bmatrix},$$

where $z_{Ai11}$ and $z_{Ai12}$ are respectively $z_{11}$ and $z_{12}$ of $Z_{Ai}$;

(4-2-7) obtaining by calculation the matrix $Y_{ee} = Y_{M1} + Y_{Ai}$;
(4-2-8) obtaining by calculation a matrix $Z_{Me4} = (Y_{ee} - Y_{M4})^{-1}$;
(4-2-9) calculating quantities $$y_{Me411} = z_{Me411} y_{ei11}^2 + (z_{Me412} + z_{Me421}) \frac{x_p - x_m}{4} + z_{Me422} y_{ei12}^2,$$

$$y_{Me412} = z_{Me412} = y_{ei11}^2 + (z_{Me411} + z_{Me422}) \frac{x_p - x_m}{4} + z_{Me421} y_{ei12}^2,$$

$$y_{Me421} = z_{Me421} Y_{ei11}^2 + (z_{Me411} + z_{Me422}) \frac{x_p - x_m}{4} + z_{Me412} y_{ei12}^2 \text{ and}$$

$$y_{Me422} = z_{Me422}^2 Y_{ei11}^2 + (z_{Me412} + z_{Me421}) \frac{x_p - x_m}{4} + z_{Me411} y_{ei12}^2$$

to obtain a matrix $$Y_{Me4} = \begin{bmatrix} y_{Me411} & y_{Me412} \\ y_{Me421} & y_{Me422} \end{bmatrix},$$

where $z_{Me411}$, $z_{Me412}$, $z_{Me421}$ and $z_{Me422}$ are respectively $z_{11}$, $z_{12}$, $z_{21}$ and $z_{22}$ of $Z_{Me4}$;

(4-2-10) obtaining by calculation the de-embedded Y-parameter matrix $Y_{D4} = Y_{Me4} Y_{ii}$ of the T4 de-embedding dummy;

(4-3) comparing the calculated $Y_{D4}$ with the simulated value $Y_{A4}$ ($\sigma$, $\in_r$) of the T4 de-embedding dummy already obtained in Step (4-1), properly correcting the values of the model parameters $\sigma$ and $\in_r$ and then turning back to Step (4-1) if the difference between the two does not meet the set error standard, and obtaining the values of $Y_{Aj}(\sigma,\in_r)(j=1,2,3,4)$ again by calculation by using the corrected model parameters; and (4-4) once turning back to Step (4-1), starting a cyclic iterative fitting process from Step (4-1) to Step (4-3), performing iterative optimization fitting by a trial and error method, and continuously correcting the values of the model parameters $\sigma$ and $\in_r$ used for calculation of intrinsic Y-parameter admittance matrices of the de-embedding dummies until a difference between the de-embedded Y-parameter admittance matrix $Y_{D4}$ of the T4 de-embedding dummy and a corresponding calculated value $Y_{A4}(\sigma, \in_r)$ meets the set error standard, that is, determining the final values for the undetermined mode parameters $\sigma$ and $\in_r$ which are necessary for the calculation of the de-embedding dummies by this iterative fitting between $Y_{D4}$ and $Y_{A4}(\sigma,\in_r)$.

(5) The $Y_{ee}$, $Y_{ii}$ and $Y_{ei}$ (actually, it is unnecessary to completely determine a specific value for all elements in $Y_{ei}$, as long as the square of the elements is determined) solved in Step (4) and the whole Y-parameter admittance matrix $Y_M$ of said DUT obtained by measurement in Step (2) are substituted into the right side of $Y_A = -Y_{ii} - Y_{ei}$ ($Y_M - Y_{ee}$)$^{-1} Y_{ei}$ to complete said general four-port on-wafer high frequency de-embedding of the parasitic four-port network, to be stripped, of passivity, reciprocity and symmetry. That is, the intrinsic Y-parameter admittance matrix $Y_A$ of said DUT is calculated by using the whole Y-parameter admittance matrix $Y_M$ of said DUT obtained by measurement. Specifically, the following steps are included:

(5-1) obtaining by calculation a matrix $Z_{Me} = (Y_{ee} - Y_M)^{-1}$;
(5-2) calculating quantities $$y_{Me11} = z_{Me11} y_{ei11}^2 + (z_{Me12} + z_{Me21}) \frac{x_p - x_m}{4} + z_{Me22} y_{ei12}^2,$$

$$y_{Me12} = z_{Me12} y_{ei11}^2 + (z_{Me11} + z_{Me22}) \frac{x_p - x_m}{4} + z_{Me21} y_{ei12}^2,$$

$$y_{Me21} = z_{Me21} y_{ei11}^2 + (z_{Me11} + z_{Me22}) \frac{x_p - x_m}{4} + z_{Me12} Y_{ei12}^2 \text{ and}$$

$$y_{Me22} = z_{Me22} y_{ei11}^2 + (z_{Me12} + z_{Me21}) \frac{x_p - x_m}{4} + z_{Me11} y_{ei12}^2$$

to obtain a matrix $$Y_{Me} = \begin{bmatrix} y_{Me11} & y_{Me12} \\ y_{Me21} & y_{Me22} \end{bmatrix},$$

where $Z_{Me11}$, $Z_{Me12}$, $Z_{Me21}$ and $Z_{Me22}$ are respectively $z_{11}$, $z_{12}$, $z_{21}$ and $z_{22}$ of $Z_{Me}$; and (5-3) obtaining by calculation the intrinsic Y-parameter admittance matrix $Y_A = Y_{Me} - Y_{ii}$ of said DUT to be de-embedded.

The foregoing descriptions are merely preferred embodiments of the present invention and the protection scope of the present invention is not limited thereto. Any changes or replacements that readily occur to those skilled in the art within the technical scope disclosed in the present invention should be included within the protection scope of the present invention. Hence, the protection scope of the present invention should be subject to the protection scope defined in the claims.

The invention claimed is:

1. A general four-port on-wafer high frequency de-embedding method, comprising the following steps:

1.1: fabricating, together with a device under test (DUT) to be de-embedded, N on-wafer de-embedding dummies;

1.2: measuring to obtain the whole Y-parameter admittance matrix $Y_M$ of said DUT and the whole Y-parameter admittance matrix $Y_{Mj}$ (j=1,2, . . . , N) of each of said de-embedding dummies;

1.3: for each de-embedding dummy, building a model considering the distributive nature of high frequency characteristics of the de-embedding dummy;

1.4: obtaining the intrinsic Y-parameter admittance matrix $Y_{Aj}(p_1, p_2, \ldots p_M)$ (j=1,2, . . . , N) of said N de-embedding dummies by calculation or simulation by using said models, where, $p_1, p_2, \ldots, p_M$ are M model parameters of models on which said calculation or simulation is based, and $4N-16 \geq M$;

1.5: solving an equation set $Y_{Mj}=Y_{ee}-Y_{ei}(Y_{Aj}(p_1, p_2, \ldots p_M)+Y_{ii})^{-1}Y_{ie}$ (j=1,2, . . . , N) for the elements of four sub-matrices $Y_{ee}$, $Y_{ii}$, $Y_{ei}$ and $Y_{ie}$ of the admittance matrix Y of the parasitic four-port network to be stripped in de-embedding and said model parameters $p_1, p_2, \ldots, p_M$ as unknowns, wherein, as shown in the following equation, $Y_{ee}$, $Y_{ii}$, $Y_{ei}$ and $Y_{ie}$ as four sub-matrices, form an admittance matrix Y of said parasitic four-port network:

$$Y = \begin{bmatrix} Y_{ee} & Y_{ei} \\ Y_{ie} & Y_{ii} \end{bmatrix};$$

and 1.6: substituting $Y_{ee}$, $Y_{ii}$, $Y_{ei}$ and $Y_{ie}$ obtained in Step 1.5 and the whole Y-parameter admittance matrix $Y_M$ of said DUT obtained by measurement in Step 1.2 into Equation $Y_A = Y_{ii} - Y_{ie}(Y_M - Y_{ee})^{-1}Y_{ei}$, to obtain by calculation the intrinsic Y-parameter admittance matrix $Y_A$ of said DUT.

2. The general four-port on-wafer high frequency de-embedding method according to claim 1, characterized in that solving the equation set $Y_{Mj}=Y_{ee}-Y_{ei}(Y_{Aj}(p_1, p_2, \ldots p_M)+Y_{ii})^{-1}Y_{ie}$(j=1,2, . . . , N) for the elements of four sub-matrixes $Y_{ee}$, $Y_{ii}$, $Y_{ei}$ and $Y_{ie}$ of the admittance matrix Y of the parasitic four-port network to be stripped in de-embedding and said model parameters $p_1, p_2, \ldots, p_M$ as unknowns in Step 1.5 comprises the following steps:

2.1: assigning initial values to said model parameters $p_1, p_2, \ldots p_M$, respectively;

2.2: obtaining the values of $Y_{Aj}(p_1, p_2, \ldots p_M)$ (j=1,2, . . . , N) by calculation or simulation by using the assigned model parameters $p_1, p_2, \ldots p_M$;

2.3: after solving an equation set $Y_{Mj}=Y_{ee}-Y_{ei}(Y_{Aj}(p_1, p_2, \ldots p_M)+Y_{ii})^{-1}Y_{ie}$ (j=1,2,3,4) by using the known measurement values $Y_{Mj}$(j=1,2,3,4) of the first four de-embedding dummies and said calculated or simulated values $Y_{Aj}(p_1, p_2, \ldots p_M)$(j=1,2,3,4) to obtain the values of $Y_{ee}$, $Y_{ii}$, $Y_{ei}$ and $Y_{ie}$, substituting the known measurement values $Y_{Mj}$(j=5,6, . . . , N) of the remaining de-embedding dummies and said obtained values of $Y_{ee}$, $Y_{ii}$, $Y_{ei}$ and $Y_{ie}$ into $Y_{Dj}=-Y_{ii}-Y_{ie}(Y_{Mj}-Y_{ee})^{-1}Y_{ei}$ (j=5,6, . . . , N) to obtain by calculation the de-embedded Y-parameter admittance matrix $Y_{Dj}$ (j=5,6, . . . , N) of said remaining de-embedding dummies;

2.4: comparing the calculated $Y_{Dj}$(j=5,6, . . . , N) with the calculated or simulated values $Y_{Aj}(p_1, p_2, \ldots p_M)$(j=5, 6, . . . , N) of the corresponding remaining de-embedding dummies already obtained in Step 2.1, determining final values for undetermined model parameters $p_1, p_2, \ldots p_M$ which are necessary for the calculation or simulation of the de-embedding dummies, if a difference between the two meets the set error standard, and correcting the values of the model parameters $p_1, p_2, \ldots p_M$ and reassigning them, and then turning back to Step 2.2, if the difference between the two does not meet the set error standard.

3. A general four-port on-wafer high frequency de-embedding method of passivity, reciprocity and symmetry, comprising the following steps:

3.1: fabricating, together with a device under test (DUT) to be de-embedded, N de-embedding dummies of passivity, reciprocity and symmetry;

3.2: measuring to obtain the whole Y-parameter admittance matrix $Y_M$ of said DUT and the whole Y-parameter admittance matrix $Y_{Mj}$ (j=1,2, . . . , N) of each of said de-embedding dummies;

3.3: for each de-embedding dummy, building a model considering the distributive nature of high frequency characteristics of the de-embedding dummy;

3.4: obtaining the intrinsic Y-parameter admittance matrices $Y_{Aj}(p_1, p_2, \ldots p_M)$(j=1,2, . . . , N) of said N de-embedding dummies by calculation or simulation by using said models, where, $p_1, p_2, \ldots, p_M$ are M model parameters of models on which said calculation or simulation is based, and $2N-6 \geq M$;

3.5: solving an equation set $Y_{Mj}=Y_{ee}-Y_{ei}(Y_{Aj}(p_1, p_2, \ldots p_M)+Y_{ii})^{-1}Y_{ei}$(j=1,2, . . . , N) for the elements of three sub-matrices $Y_{ee}$, $Y_{ii}$ and $Y_{ei}$ of the admittance matrix Y of the parasitic four-port network to be stripped in de-embedding and said model parameters $p_1, p_2, \ldots, p_M$ as unknowns, wherein, as shown in the following equation, $Y_{ee}$, $Y_{ii}$ and $Y_{ei}$, as three sub-matrices, form the admittance matrix Y of said parasitic four-port network:

$$Y = \begin{bmatrix} Y_{ee} & Y_{ei} \\ Y_{ei} & Y_{ii} \end{bmatrix};$$

and 3.6: substituting $Y_{ee}$, $Y_{ii}$ and $Y_{ei}$ obtained in Step 3.5 and the whole Y-parameter admittance matrix $Y_M$ of said DUT obtained by measurement in Step 3.2 into Equation $Y_A = -Y_{ii} - Y_{ei}(Y_M - Y_{ee})^{-1}Y_{ei}$, to obtain by calculation the intrinsic Y-parameter admittance matrix $Y_A$ of said DUT.

4. The special general four-port on-wafer high frequency de-embedding method according to claim 3, characterized in that solving the equation set $Y_{Mj}=Y_{ee}-Y_{ei}(Y_{Aj}(p_1, p_2, \ldots p_M)+Y_{ii})^{-1}Y_{ei}$(j=1,2, . . . , N for the elements of three sub-matrices $Y_{ee}$, $Y_{ii}$ and $Y_{ei}$ of the admittance matrix Y of the parasitic four-port network to be stripped in de-embedding and said model parameters $p_1, p_2, \ldots, p_M$ as unknowns in Step 3.5 comprises the following steps:

4.1: assigning initial values to said model parameters $p_1, p_2, \ldots p_M$, respectively;

4.2: obtaining the values of $Y_{Aj}(p_1, p_2, \ldots p_M)$ (j=1,2,...,N) by calculation or simulation by using the assigned model parameters $p_1, p_2, \ldots p_M$;

4.3: after solving an equation set $Y_{Mj}=Y_{ee}-Y_{ei}(Y_{Aj}(p_1, p_2, \ldots p_M)+Y_{ii})^{-1} Y_{ei}$ (j=1,2,3) by using the known measurement values $Y_{Mj}$(j=1,2,3) of first three de-embedding dummies and said calculated or simulated values $Y_{Aj}(p_1, p_2, \ldots p_M)$ (j=1,2,3) to obtain the values of $Y_{ee}, Y_{ii}$ and $Y_{ei}$ (it is unnecessary to completely solve $Y_{ei}$, referring to claim 5.4), substituting the known measurement values $Y_{Mj}$ (j=4,5, ..., N) of the remaining de-embedding dummies and said obtained values of $Y_{ee}, Y_{ii}$ and $Y_{ei}$ into $Y_{Dj}=-Y_{ii}-Y_{ei}(Y_{Mj}-Y_{ee})^{-1} Y_{ei}$ (j=4,5, ..., N) to obtain by calculation the de-embedded Y-parameter admittance matrices $Y_{Dj}$ (j=4,5, ..., N) of said remaining de-embedding dummies;

4.4: comparing the calculated $Y_{Dj}$(j=4,5, ..., N) with the calculated or simulated values $Y_{Aj}(p_1, p_2, \ldots p_M)$(j=4, 5, ..., N) of the corresponding remaining de-embedding dummies already obtained in Step 4.1, determining final values for undetermined model parameters $p_1, p_2, \ldots p_M$ which are necessary for the calculation or simulation of the de-embedding dummies, if a difference between the two meets the set error standard, and correcting the values of the model parameters $p_1, p_2, \ldots p_M$ and reassigning them, and then turning back to Step 4.2, if the difference between the two does not meet the set error standard.

5. The special general four-port on-wafer high frequency de-embedding method according to claim 4, characterized in that solving the equation set $Y_{Mj}=Y_{ee}-Y_{ei}(Y_{Aj}(p_1, p_2, \ldots p_M)+Y_{ii})^{-1}Y_{ei}$ (j=1,2,3) to further obtain by calculation the de-embedded Y-parameter admittance matrices $Y_{Dj}$ (j=4,5, ..., N) of said remaining de-embedding dummies in Step 4.3 comprises the following steps:

5.1: obtaining by calculation matrices $Z_{2A}=(Y_{A2}-Y_{A1})^{-1}$, $Z_{2M}=(Y_{M2}-Y_{M1})^{-1}$, $Z_{3A}=(Y_{A3}-Y_{A1})^{-1}$ and $Z_{3M}=(Y_{M3}-Y_{M1})^{-1}$, where exponent −1 represents matrix inversion;

5.2: calculating quantities $$r_{2p} = \frac{z_{2A11}+z_{2A12}}{z_{2M11}+z_{2M12}}, r_{3p} = \frac{z_{3A11}+z_{3A12}}{z_{3M11}+z_{3M12}}, r_{2m} = \frac{z_{2A11}-z_{2A12}}{z_{2M11}-z_{2M12}},$$

$$r_{3m} = \frac{z_{3A11}-z_{3A12}}{z_{3M11}-z_{3M12}},$$

$$y_p = \frac{r_{3p}(y_{A311}+y_{A312})-r_{2p}(y_{A211}+y_{A212})}{r_{2p}-r_{3p}},$$

$$y_m = \frac{r_{3m}(y_{A311}-y_{A312})-r_{2m}(y_{A211}-y_{A212})}{r_{2m}-r_{3m}},$$

$$x_p = r_{2p}(y_p+y_{A111}+y_{A112})(y_p+y_{A211}+y_{A212}) \text{ and}$$

$$x_m = r_{2m}(y_m+y_{A111}-y_{A112})(y_m+y_{A211}-y_{A212}),$$

where $z_{2A11}$ and $z_{2A12}$ are respectively $z_{11}$ and $z_{12}$ of $Z_{2A}$; $z_{2M11}$ and $z_{2M12}$ are respectively $z_{11}$ and $z_{12}$ of $Z_{2M}$; $z_{3A11}$ and $z_{3A12}$ are respectively $z_{11}$ and $z_{12}$ of $Z_{3A}$; $z_{3M11}$ and $z_{3M12}$ are respectively $z_{11}$ and $z_{12}$ of $Z_{3M}$; $y_{A111}$ and $y_{A112}$ are respectively $y_{11}$ and $y_{12}$ of $Y_{A1}$; $y_{A211}$ and $y_{A212}$ are respectively $y_{11}$ and $y_{12}$ of $Y_{A2}$; $y_{A311}$ and $y_{A312}$ are respectively $y_{11}$ and $y_{12}$ of $Y_{A3}$;

5.3: calculating quantities $$y_{ii11} = \frac{y_p+y_m}{2} \text{ and } y_{ii12} = \frac{y_p-y_m}{2}$$

to obtain a matrix $$Y_{ii} = \begin{bmatrix} y_{ii11} & y_{ii12} \\ y_{ii12} & y_{ii11} \end{bmatrix};$$

5.4: obtaining by calculation the square of elements $y_{11}$ and $y_{12}$ of the matrix $$Y_{ei}: y_{ei11}^2 = \frac{x_p+x_m \pm 2\sqrt{x_p x_m}}{4} \text{ and } y_{ei12}^2 = \frac{x_p+x_m \mp 2\sqrt{x_p x_m}}{4},$$

where the plus-minus sign is selected such that, at the low frequency limit, $y_{ei11}^2$ tends to infinity and $y_{ei12}^2$ tends to zero, and both $y_{ei11}^2$ and $y_{ei12}^2$ continuously vary with frequency;

5.5: obtaining by calculation a matrix $Z_{Ai}=(Y_{A1}+Y_{ii})^{-1}$;

5.6: calculating quantities $$y_{Ai11} = z_{Ai11}\frac{x_p+x_m}{2}+z_{Ai12}\frac{x_p-x_m}{2} \text{ and}$$

$$y_{Ai12} = z_{Ai12}\frac{x_p+x_m}{2}+z_{Ai11}\frac{x_p-x_m}{2}$$

to obtain a matrix $$Y_{Ai} = \begin{bmatrix} y_{Ai11} & y_{Ai12} \\ y_{Ai12} & y_{Ai11} \end{bmatrix},$$

where $z_{Ai11}$ and $z_{Ai12}$ are respectively $z_{11}$ and $z_{12}$ of $Z_{Ai}$;

5.7: obtaining by calculation a matrix $Y_{ee}=-Y_{M1}-Y_{Ai}$;

5.8: obtaining by calculation a matrix $Z_{Mej}=(Y_{ee}-Y_{Mj})^{-1}$ (j=4,5, ..., N);

5.9: calculating quantities $$y_{Mej11} = z_{Mej11}y_{ei11}^2 + (z_{Mej12}+z_{Mej21})\frac{x_p-x_m}{4} + z_{Mej22}y_{ei12}^2 (j=4, 5, \ldots, N),$$

$$y_{Mej12} = z_{Mej12}y_{ei11}^2 + (z_{Mej11}+z_{Mej22})\frac{x_p-x_m}{4} + z_{Mej21}y_{ei12}^2 (j=4, 5, \ldots, N),$$

$$y_{Mej21} = z_{Mej21}y_{ei11}^2 + (z_{Mej11}+z_{Mej22})\frac{x_p-x_m}{4} + z_{Mej12}y_{ei12}^2 (j=4, 5, \ldots, N) \text{ and}$$

$$y_{Mej22} = z_{Mej22}y_{ei11}^2 + (z_{Mej12}+z_{Mej21})\frac{x_p-x_m}{4} + z_{Mej11}y_{ei12}^2 (j=4, 5, \ldots, N)$$

to obtain a matrix $$Y_{Mej} = \begin{bmatrix} y_{Mej11} & y_{Mej12} \\ y_{Mej21} & y_{Mej22} \end{bmatrix} \ (j = 4, 5, \ldots, N),$$

where $z_{Mej11}$, $z_{Mej12}$, $z_{Mej21}$ and $z_{Mej22}$ are respectively $z_{11}$, $z_{12}$, $z_{21}$ and $z_{22}$ of $Z_{Mej}$; and 5.10: obtaining by calculation the de-embedded Y-parameter matrices) $Y_{Di} = Y_{Mej} - Y_{ii}$ (j=4,5, . . . , N) of said remaining de-embedding dummies.

6. The special general four-port on-wafer high frequency de-embedding method according to claim 3, characterized in that calculating the intrinsic Y-parameter admittance matrix $Y_A$ of said DUT by using the whole Y-parameter admittance matrix $Y_M$ of said DUT obtained by measurement in Step 3.6 comprises the following steps:

6.1: obtaining by calculation a matrix $Z_{Me} = (Y_{ee} - Y_M)^{-1}$;

6.2: calculating quantities $$y_{Me11} = z_{Me11} y_{ei11}^2 + (z_{Me12} + z_{Me21}) \frac{x_p - x_m}{4} + z_{Me22} y_{ei12}^2,$$

$$y_{Me12} = z_{Me12} y_{ei11}^2 + (z_{Me11} + z_{Me22}) \frac{x_p - x_m}{4} + z_{Me21} y_{ei12}^2,$$

-continued $$y_{Me21} = z_{Me21} y_{ei11}^2 + (z_{Me11} + z_{Me22}) \frac{x_p - x_m}{4} + z_{Me12} Y_{ei12}^2 \ \text{and}$$

$$y_{Me22} = z_{Me22} y_{ei11}^2 + (z_{Me12} + z_{Me21}) \frac{x_p - x_m}{4} + z_{Me11} y_{ei12}^2$$

to obtain a matrix $$Y_{Me} = \begin{bmatrix} y_{Me11} & y_{Me12} \\ y_{Me21} & y_{Me22} \end{bmatrix},$$

where $z_{Me11}$, $z_{Me12}$, $z_{Me21}$ and $z_{Me22}$ are respectively $z_{11}$, $z_{12}$, $z_{21}$ and $z_{22}$ of $Z_{Me}$; and 6.3: obtaining by calculation the intrinsic Y-parameter admittance matrix $Y_A = Y_{Me} - Y_{ii}$ of the DUT to be de-embedded.

* * * * *